(12) United States Patent
Kim

(10) Patent No.: US 12,204,373 B2
(45) Date of Patent: Jan. 21, 2025

(54) DISPLAY DEVICE

(71) Applicant: LG Display Co., Ltd., Seoul (KR)

(72) Inventor: Han Seok Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 198 days.

(21) Appl. No.: 18/020,735

(22) PCT Filed: Oct. 6, 2021

(86) PCT No.: PCT/KR2021/013721
§ 371 (c)(1),
(2) Date: Feb. 10, 2023

(87) PCT Pub. No.: WO2022/145644
PCT Pub. Date: Jul. 7, 2022

(65) Prior Publication Data
US 2023/0297137 A1 Sep. 21, 2023

(30) Foreign Application Priority Data
Dec. 31, 2020 (KR) .................. 10-2020-0189393

(51) Int. Cl.
*G06F 1/16* (2006.01)
*H10K 59/18* (2023.01)
*H10K 59/80* (2023.01)

(52) U.S. Cl.
CPC .......... *G06F 1/1647* (2013.01); *G06F 1/1656* (2013.01); *G06F 1/1681* (2013.01); *H10K 59/18* (2023.02); *H10K 59/87* (2023.02)

(58) Field of Classification Search
CPC .. H05K 5/0017; H05K 5/0217; H05K 5/0221; H05K 5/0226; H05K 5/04; H05K 7/1427; H05K 5/0018; G06F 3/1446; G06F 1/1647; G06F 1/1656; G06F 1/1681; G06F 1/1652; G06F 1/1637; H10K 59/18; H10K 59/872; H10K 59/87; G09F 9/301; G09F 9/335

See application file for complete search history.

(56) References Cited

U.S. PATENT DOCUMENTS

| 2018/0164498 A1 | 6/2018 | Kim et al. |
| 2019/0166704 A1 | 5/2019 | Shin et al. |
| 2020/0194539 A1* | 6/2020 | Kim ................. H10K 50/84 |

FOREIGN PATENT DOCUMENTS

| JP | 6695507 B1 | 5/2020 |
| KR | 20-0355160-1 | 7/2004 |
| KR | 10-2011-0065638 A | 6/2011 |

(Continued)

*Primary Examiner* — Jinhee J Lee
*Assistant Examiner* — Peter Krim
(74) *Attorney, Agent, or Firm* — Birch, Stewart, Kolasch & Birch, LLP

(57) ABSTRACT

According to an aspect of the present disclosure, a display device includes a display panel, a plurality of panel magnets disposed on a rear surface of the display panel, a cover shield exposing the plurality of panel magnets, a packaging member, and a plurality of hinge members connected to the packaging member and the cover shield. The packaging member can include a plurality of first packaging members having a plurality of fixation plates to be fixable to the plurality of panel magnets, and a plurality of second packaging members to be fixable to the cover shield.

10 Claims, 13 Drawing Sheets

(56) References Cited

FOREIGN PATENT DOCUMENTS

| | | |
|---|---|---|
| KR | 10-2018-0065734 A | 6/2018 |
| KR | 10-2020-0073998 A | 6/2020 |
| WO | WO-2020176719 A1 * | 9/2020 ........... G06F 1/1616 |

* cited by examiner

DISPLAY DEVICE

CROSS-REFERENCE TO RELATED APPLICATIONS

This application is the National Stage filing under 35 U.S.C. 371 of International Application No. PCT/KR2021/013721, filed on Oct. 6, 2021, which claims the benefit of earlier filing date and right of priority to Korean Application No. 10-2020-0189393, filed on Dec. 31, 2020, where the contents of all these applications are hereby incorporated by reference herein in their entirety.

BACKGROUND

Technical Field

The present disclosure relates to a display device, and more particularly, to a display device which enables safe packaging and conveying by protecting the side surfaces of a display panel.

Discussion of the Related Art

In display devices which are used for monitors of computers, TVs, mobile phones, or the like, there are an organic light emitting display (OLED) device, and the like that self-emit light, a liquid crystal display (LCD) device, and the like that require a separate light source, etc.

The display devices are diversified in application ranges up to personal mobile devices as well as monitors of computers and TVs, and research on display devices with reduced volume and weight as well as a wide display area has been conducted.

Meanwhile, a tiling display device with a large display area is attached on a wall surface and the like by connecting a plurality of display devices to each other, and can be used as a billboard and the like.

SUMMARY OF THE DISCLOSURE

An object to be achieved by the present disclosure is to provide a display device capable of protecting the side surfaces of a display panel.

Another object to be achieved by the present disclosure is to provide a display device which enables easy packaging and opening and safe conveying.

Yet another object to be achieved by the present disclosure is to provide a display device in which a packing member protects an edge of the display device when transporting the display device and is hidden to a rear surface of the display device during tiling, and the packaging member is easily reused and stored.

Objects of the present disclosure are not limited to the above-mentioned objects, and other objects, which are not mentioned above, can be clearly understood by those skilled in the art from the following descriptions.

According to an aspect of the present disclosure, a display device can include a display panel; a plurality of panel magnets disposed on a rear surface of the display panel along a first side surface of the display panel and a second side surface facing the first side surface; a cover shield disposed on the rear surface of the display panel, in which positions corresponding to the plurality of panel magnets are opened to expose the plurality of panel magnets; a plurality of packaging members configured to be connected to the cover shield to cover or expose the side surfaces of the display panel and the cover shield; and a plurality of hinge members connected to the plurality of packaging members and the cover shield so that the plurality of packaging members is rotatable with respect to the cover shield, in which the plurality of packaging members includes a plurality of first packaging members disposed to correspond to the first side surface and the second side surface of the display panel, respectively, and including a plurality of fixation plates disposed to be fixable to the plurality of panel magnets, and a plurality of second packaging members disposed to correspond to a third side surface and a fourth side surface of the display panel, and disposed to be fixable to the cover shield.

Other detailed matters of the exemplary embodiments are included in the detailed description and the drawings.

According to the present disclosure, it is possible to protect the side surfaces of a display panel in which wirings and the like can be positioned.

According to the present disclosure, it is possible to easily package or open a display device by using a packaging member which protects the display device to be safely conveyed.

According to the present disclosure, the display device is packaged by using a packaging member which is conveniently reused and stored to minimize cost for reproducing the packaging member and a loss risk of the packaging member.

The effects according to the present disclosure are not limited to the contents exemplified above, and more various effects are included in the present specification.

DETAILED DESCRIPTION OF THE EMBODIMENTS

Figure 1:
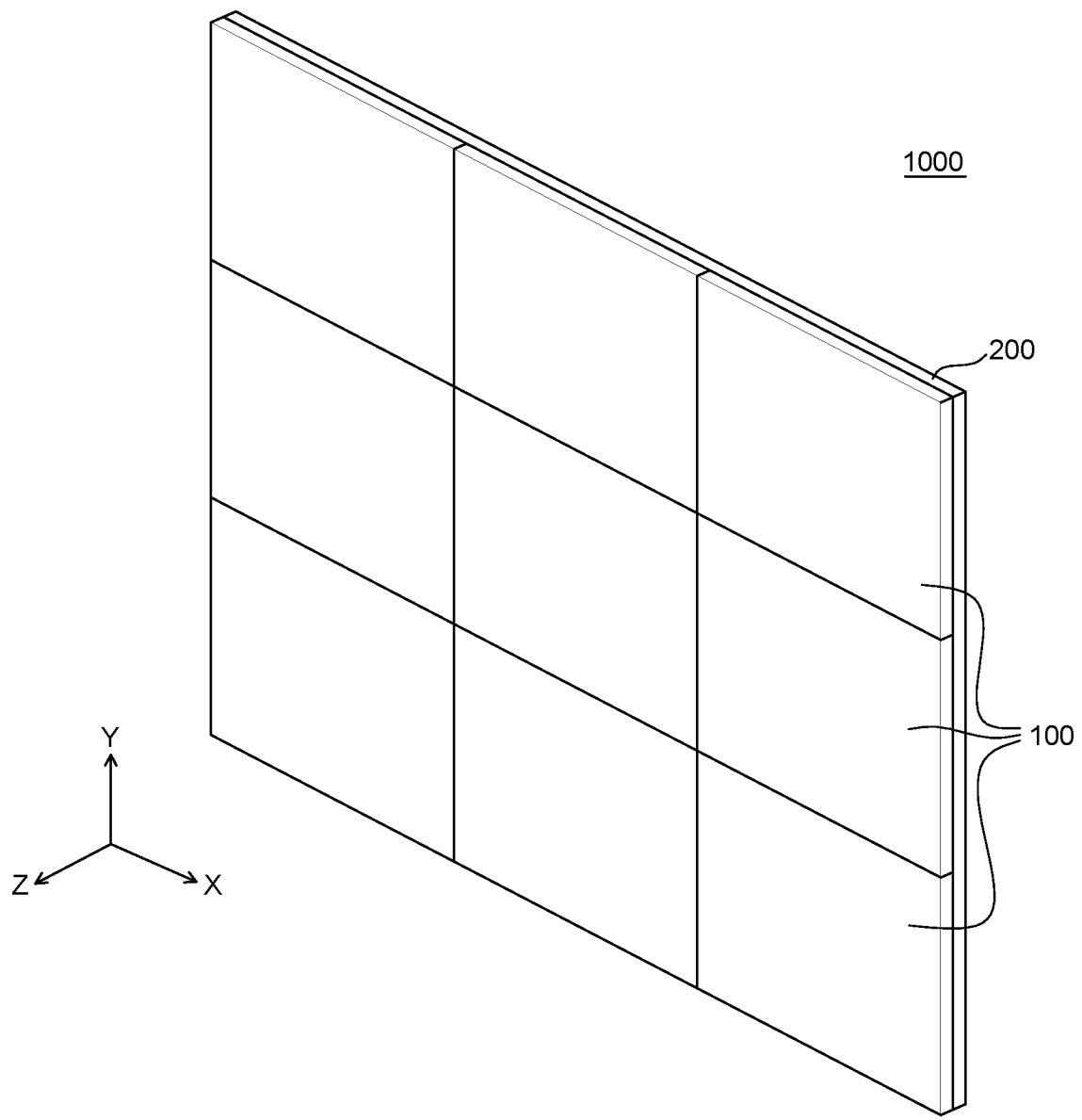
FIG. 1 is a perspective view of a tiling display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as 'including', 'having', etc. used herein are generally intended to allow other components to be added unless the terms are used with the term 'only'. Any references to singular can include plural unless expressly stated otherwise.

Components are interpreted to include an ordinary error range even if not expressly stated.

When the position relation between two parts is described using the terms such as 'on', 'above', 'over', 'below', 'next', one or more parts can be positioned between the two parts unless the terms are used with the term 'immediately' or 'directly'.

When an element or layer is disposed "on" another element or layer, one or more additional layers or elements can be interposed directly on the other element or therebetween.

Although the terms "first", "second", and the like are used for describing various components, these components are not confined by these terms. These terms are merely used for distinguishing one component from the other components. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, the present disclosure will be described in detail with reference to accompanying drawings.

FIG. 1 is a perspective view of a tiling display device according to an exemplary embodiment of the present disclosure. Referring to FIG. 1, a tiling display device 1000 according to an exemplary embodiment of the present disclosure is achieved by connecting a plurality of display devices 100 to each other according to an exemplary embodiment of the present disclosure.

Referring to FIG. 1, the tiling display device 1000 according to an exemplary embodiment of the present disclosure includes the plurality of display devices 100 and a wall surface portion 200. The tiling display device 1000 includes the plurality of display devices 100 to enlarge a display area in which an image is displayed.

Each of the plurality of display devices 100 is attached to the wall surface portion 200 to be disposed like one display device 100. For example, the plurality of display devices 100 is attached to the wall surface portion 200 in a tile form to implement the tiling display device 1000.

Meanwhile, since the tiling display device 1000 has an extra-large size, it can be difficult to convey the tiling display device 1000 to an installation place while the plurality of display devices 100 is connected to each other. Thus, after the plurality of display devices 100 is conveyed to the installation place, the plurality of display devices 100 can be assembled to the tiling display device 1000 in the installation place.

In this case, the plurality of display devices 100 can be attached to each other as close as possible so that intervals between the plurality of display devices 100 are constant and minimized so that the plurality of display devices 100 looks like one display device. For example, the plurality of display devices 100 is precisely aligned to be attached to the wall surface portion 200, thereby minimizing a boundary area in which an image is not displayed.

In this case, each of the plurality of display devices 100 can be aligned in an X-axis direction, a Y-axis direction, and a Z-axis direction to be attached to the wall surface portion 200. When the plurality of display devices 100 is aligned in the X-axis direction, a left edge and a right edge of the plurality of display devices 100 disposed in the same column can be aligned to be disposed in a straight line, respectively. In addition, when the plurality of display devices 100 is aligned in the Y-axis direction, an upper edge and a lower edge of the plurality of display devices 100 disposed in the same row can be aligned to be disposed in a straight line, respectively. In addition, when the plurality of display devices 100 is aligned in the Z-axis direction, all front surfaces of the plurality of display devices 100 can be aligned to be disposed on one plane so as to remove steps between the plurality of display devices 100.

Figure 2:
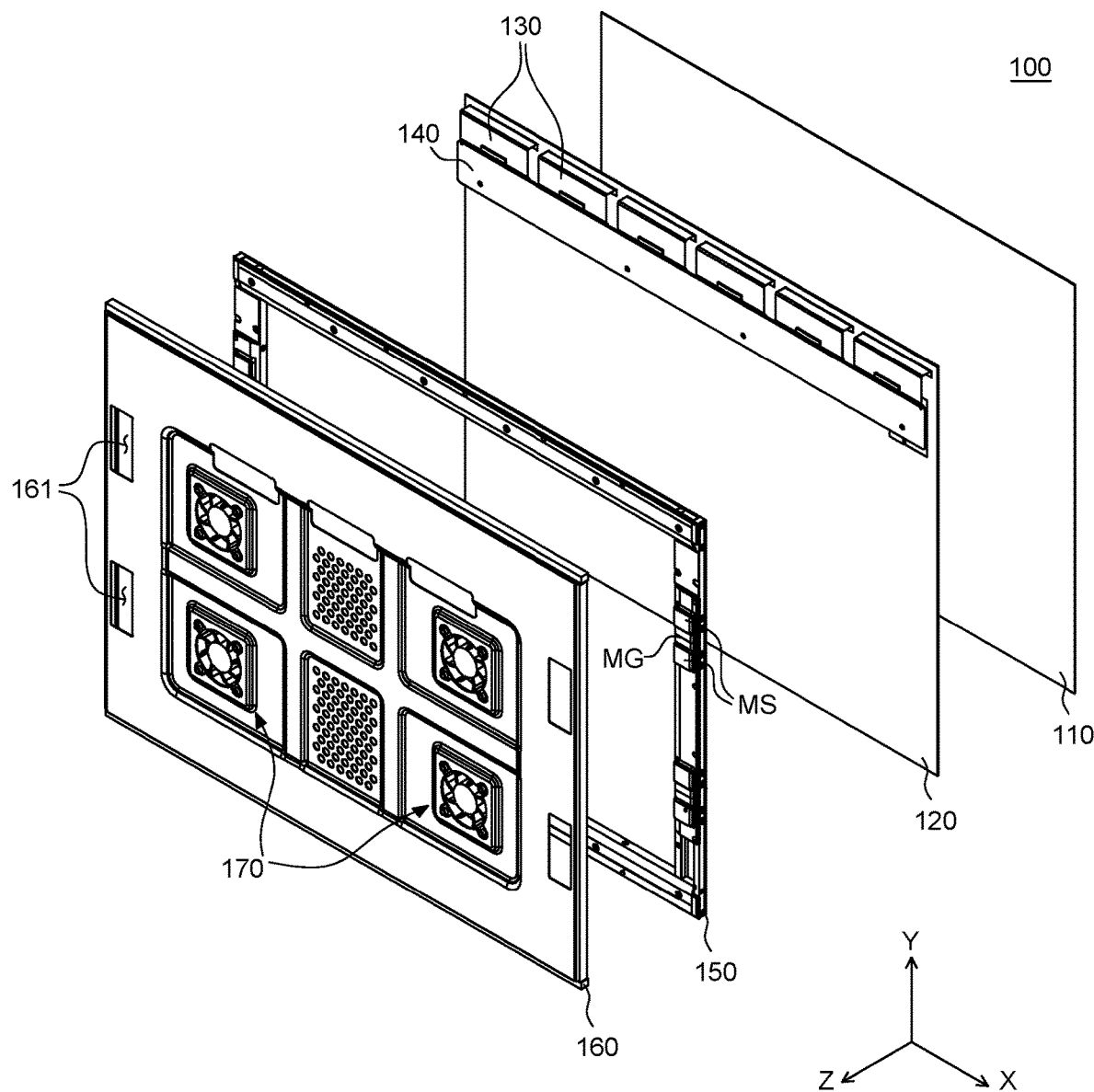
FIG. 2 is an exploded perspective view of the display device according to an exemplary embodiment of the present disclosure.

FIG. 2 is an exploded perspective view of the display device 100 according to an exemplary embodiment of the present disclosure. Specifically, FIG. 2 is an exploded perspective view of the display device 100 viewed from the rear surface of the display device 100. In FIG. 2, for the convenience of the description, illustration of the packaging member is omitted.

Referring to FIG. 2, the display device 100 includes a protective plate 110, a display panel 120, a plurality of flexible films 130, a printed circuit board 140, a frame 150, a cover shield 160, a heat dissipation fan 170, a plurality of panel magnets MG, a plurality of panel materials MS, and a plurality of packaging members 180.

First, the display panel 120 is a component for displaying an image to a user. The display panel 120 can be disposed with, for example, a display element, and circuits, lines, component, and the like for driving the display element. The display element can be defined differently depending on a type of display panel 120, and for example, when the display panel 120 is an organic light emitting display panel, the display element can be an organic light emitting diode including an anode, an organic emission layer, and a cathode. For example, if the display panel 120 is an inorganic light emitting display panel, the display element can be a light emitting diode (LED) or a micro LED including an n-type semiconductor layer, a p-type semiconductor layer, and an emission layer. However, the present disclosure is not limited thereto, and the display element of the display panel 120 can be variously configured.

The plurality of flexible films 130 is bonded to the rear surface of the display panel 120. The flexible film 130 can be electrically connected to the display panel 120 as a film for supplying a signal to the display element and a circuit unit by disposing various components in a flexible base film. The plurality of flexible films 130 can supply a power supply voltage, a data voltage, and the like to the display panel 120. On the other hand, in FIG. 2, it is illustrated that the number of flexible films 130 is 6 and the plurality of flexible films 130 is bonded to a long side of the display panel 120. However, the number of flexible films 130 and a layout of the plurality of flexible films 130 can be variously changed according to a design, but are not limited thereto.

Driving integrated circuits (ICs) such as a gate driver IC and a data driver IC can be disposed in the plurality of flexible films 130. The driving IC is a component that processes data for displaying an image and a driving signal for processing the data. The driving IC can be disposed by a method such as chip on glass (COG), chip on film (COF), and tape carrier package (TCP), in accordance with a mounting method. However, for the convenience of the description, the method is described as the chip on film method in which the driving ICs are mounted on the plurality of flexible films 130, but is not limited thereto.

The printed circuit board 140 is electrically connected to the plurality of flexible films 130. The printed circuit board 140 is a component that supplies a signal to the driving IC. The printed circuit board 140 can be disposed with various components for supplying various signals such as a driving signal and a data signal to the driving ICs. On the other hand, in FIG. 2, it is illustrated that the number of printed circuit boards 140 is 1, but the number of printed circuit boards 140 can be variously changed according to a design, and is not limited thereto.

The frame 150 is disposed on the rear surface of the display panel 120. The frame 150 can support and protect the display panel 120 on the rear surface of the display panel 120. The frame 150 can be made of a rigid material, and for example, can be made of a metal material such as aluminum (Al), copper (Cu), zinc (Zn), silver (Ag), gold (Au), iron (Fe), steel use stainless (SUS) or invar, or a material such as plastic.

The frame 150 can have a shape corresponding to an edge of the display panel 120. For example, the frame 150 can be formed in a frame shape corresponding to the edge of the display panel 120. The frame 150 can support the edge of the display panel 120 to allow the display panel 120 to be maintained in a flat state. However, the frame 150 can also be formed in the same shape as the planar shape of the display panel 120 instead of the frame shape, and the shape of the frame 150 is not limited thereto so long as the frame 150 can support the display panel 120.

The plurality of panel magnets MG is disposed on the rear surface of the display panel 120. The plurality of panel magnets is disposed on the rear surface of the display panel 120 along a first side surface of the display panel 120 and a second side surface facing the first side surface. Here, the first side surface and the second side surface can be a left side surface and a right side surface, but are not limited thereto. The plurality of panel magnets MG can be fixed to the rear surface of the frame 150 on the rear surface of the display panel 120. The plurality of panel magnets MG is a component which is disposed on the rear surfaces of the display panel 120 and the frame 150 to attach the display device 100 to the wall surface portion 200. For example, the plurality of panel magnets MG can be bar-shaped magnets including one N pole and one S pole, but is not limited thereto. In this case, the plurality of panel magnets MG can be fixed to the frame 150 using an adhesive member or a separate fastening member, but is not limited thereto.

The plurality of panel ferromagnetic materials MS is disposed on the rear surface of the display panel 120. The plurality of panel ferromagnetic materials MS can be fixed to the rear surface of the frame 150 on the rear surface of the display panel 120. The plurality of panel ferromagnetic materials MS can be disposed on both side surfaces of each of the plurality of panel magnets MG. Each of the plurality of panel magnets MG can be disposed between the plurality of panel ferromagnetic materials MS. For example, one panel ferromagnetic material MS of the plurality of panel ferromagnetic materials MS can be in contact with an N pole of the panel magnet MG and the other panel ferromagnetic material MS can be in contact with an S pole of the panel magnet MG. One panel magnet MG can be disposed between the two panel ferromagnetic materials MS. The plurality of panel ferromagnetic materials MS can be made of a ferromagnetic material, for example, steel, but is not limited thereto.

The display device 100 can be attached to the wall surface portion 200 by using the plurality of panel magnets MG and the plurality of panel ferromagnetic materials MS. For example, when the display device 100 is in contact with the wall surface portion 200, magnetic field lines are induced among the wall surface portion 200, the panel magnets MG, and the panel ferromagnetic materials MS so that the display device 100 can be fixed to the wall surface portion 200. In this case, the plurality of panel ferromagnetic materials MS is omitted, and the display device 100 can be attached to the wall surface portion 200 by only the plurality of panel magnets MG. Meanwhile, the method of attaching the display device 100 to the wall surface portion 200 by using the plurality of panel magnets MG and the plurality of panel ferromagnetic materials MS is exemplified. However, other fastening members can also be disposed instead of the plurality of panel magnets MG and the plurality of panel ferromagnetic materials MS, but the present disclosure is not limited thereto.

Referring to FIG. 2 together, the cover shield 160 is disposed on the rear surface of the frame 150. The cover shield 160 can cover the plurality of flexible films 130 and the printed circuit board 140 on the rear surface of the frame 150. Specifically, the plurality of flexible films 130 is bonded to the rear surface of the display panel 120. In this case, the plurality of flexible films 130 and the printed circuit board 140 are not disposed between the display panel 120 and the frame 150, but can be disposed to cover the frame 150. The plurality of flexible films 130 can be easily bent as a film in which various components are disposed on the flexible base film as described above. Accordingly, the plurality of flexible films 130 is bent to cover the frame 150, so that the plurality of flexible films 130 and the printed circuit board 140 can be disposed on the display panel 120 and the frame 150.

The cover shield 160 is disposed to cover the display panel 120, the plurality of flexible films 130, the printed circuit board 140, and the frame 150. Specifically, since the frame 150 does not cover the plurality of flexible films 130 and the printed circuit board 140, it can be difficult to protect the plurality of flexible films 130 and the printed circuit board 140 from an external impact. Therefore, the cover shield 160 can be disposed on the rear surface of the frame 150 to protect the plurality of flexible films 130 and the printed circuit board 140. The cover shield 160 is disposed to cover the display panel 120, the plurality of flexible films 130, the printed circuit board 140, and the frame 150 to protect other components of the display device 100, particularly, the plurality of flexible films 130 and the printed circuit board 140.

The cover shield 160 includes a plurality of first holes 161 in which positions corresponding to the plurality of panel magnets MG and the plurality of panel ferromagnetic materials MS are opened to expose the plurality of panel magnets MG and the plurality of panel ferromagnetic materials MS.

Referring to FIG. 2, the plurality of first holes 161 can be holes which expose the plurality of panel magnets MG and the plurality of panel ferromagnetic materials MS fixed to the rear surface of the frame 150. The plurality of panel magnets MG and the plurality of panel ferromagnetic materials MS exposed through the plurality of first holes 161 can be in closer contact with the wall surface portion 200 and the intensity of a magnetic field line can be increased. If the plurality of panel magnets MG and the plurality of panel ferromagnetic materials MS are covered with the cover shield 160, the cover shield 160 can weaken the intensity of the magnetic field line by increasing intervals between the wall surface portion 200 and the plurality of panel magnets MG and the plurality of panel ferromagnetic materials MS, and the display device 100 can be detached from the wall surface portion 200. Thus, the plurality of first holes 161 is disposed so that the plurality of panel magnets MG and the plurality of panel ferromagnetic materials MS are disposed adjacent to the wall surface portion 200 to firmly attach the display device 100 to the wall surface portion 200.

Meanwhile, the cover shield 160 can include a plurality of second holes for heat dissipation. The plurality of second holes can be disposed at least to overlap the flexible films 130 and the printed circuit board 140. The plurality of second holes can be disposed at least to overlap the flexible films 130 and the printed circuit board 140 extremely heated to effectively dissipate the heat generated from the display device 100.

The heat dissipation fan 170 can be disposed on the rear surface of the display panel 120. The heat dissipation fan 170 can circulate air between the cover shield 160 and the display panel 120 to dissipate the heat generated when driving the display device 100. The heat of the display device 100 can be dissipated by convecting the air in the display device 100 by using the heat dissipation fan 170. In this case, the air can be introduced or emitted through the heat dissipation fan 170 and the plurality of second holes of the cover shield 160. On the other hand, in FIG. 2, it is illustrated that four heat dissipation fans 170 are disposed, but the heat dissipation fans 170 can be omitted according to a design, and the number of heat dissipation fans 170 and the layout of the heat dissipation fans 170 are not limited thereto.

The protective plate 110 is disposed to cover the front surface of the display panel 120. The protective plate 110 is disposed to cover the display panel 120 to protect the display panel 120 from external impact, moisture, heat, or the like. The protective plate 110 can be made of a material with impact resistance and light transmittance. For example, the protective plate 110 can be a substrate made of glass, or a thin film made of a plastic material such as polycarbonate (PC), polyimide (PI), polymethylmethacrylate (PMMA), and polyethylene terephthalate (PET), but is not limited thereto.

Hereinafter, the plurality of packaging members of the display device 100 according to an exemplary embodiment of the present disclosure will be described with reference to FIGS. 3 to 5C together.

Figure 3:
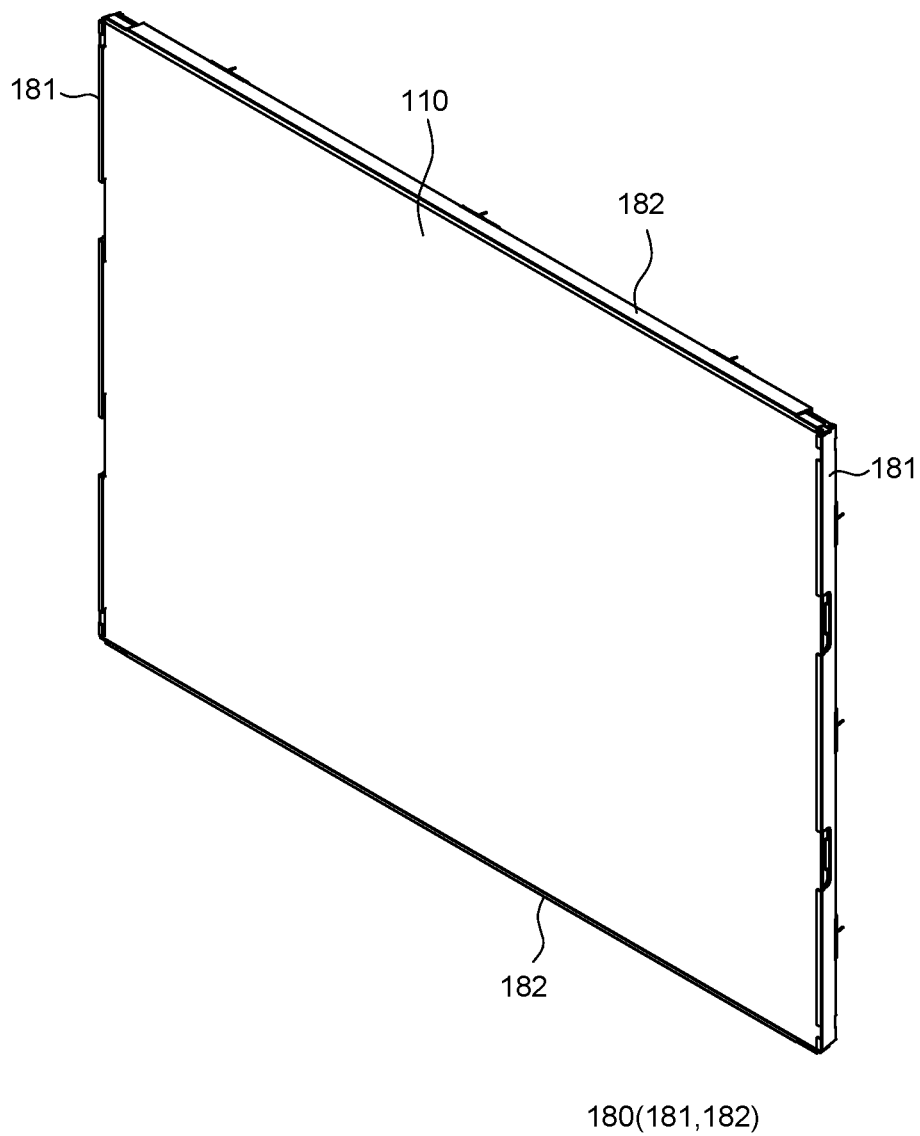
FIG. 3 is a front perspective view of the display device according to an exemplary embodiment of the present disclosure.
Figure 4:
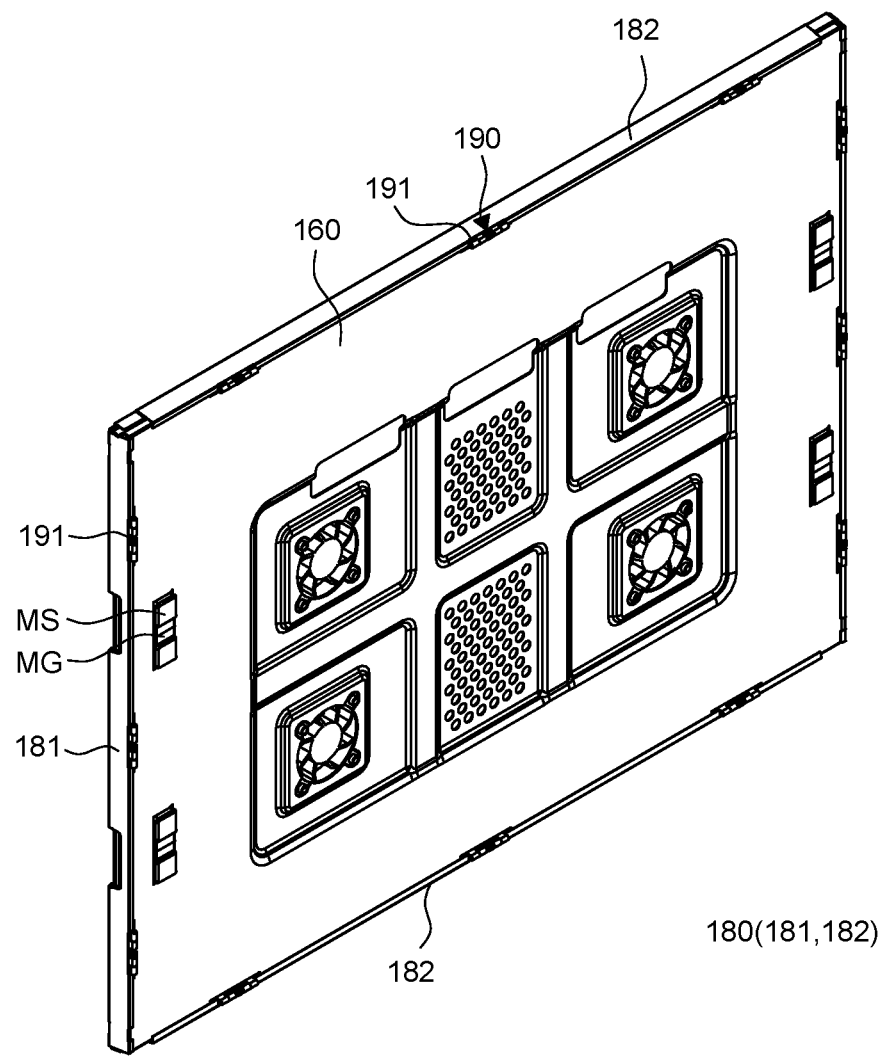
FIG. 4 is a rear perspective view of the display device according to an exemplary embodiment of the present disclosure.
Figure 5A:
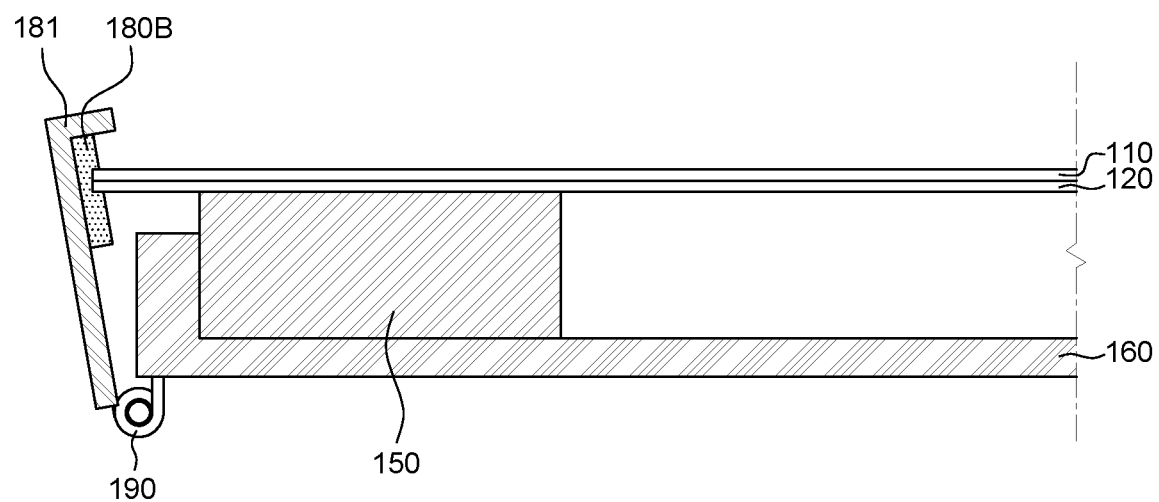
FIGS. 5A and 5B are cross-sectional views for describing a first packaging member according to an exemplary embodiment of the present disclosure.
Figure 5B:
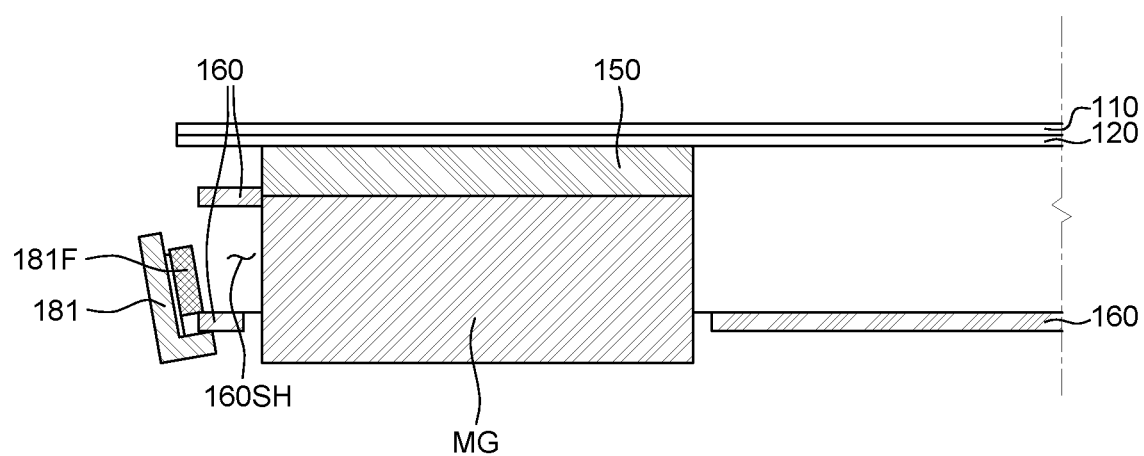
Figure 5C:
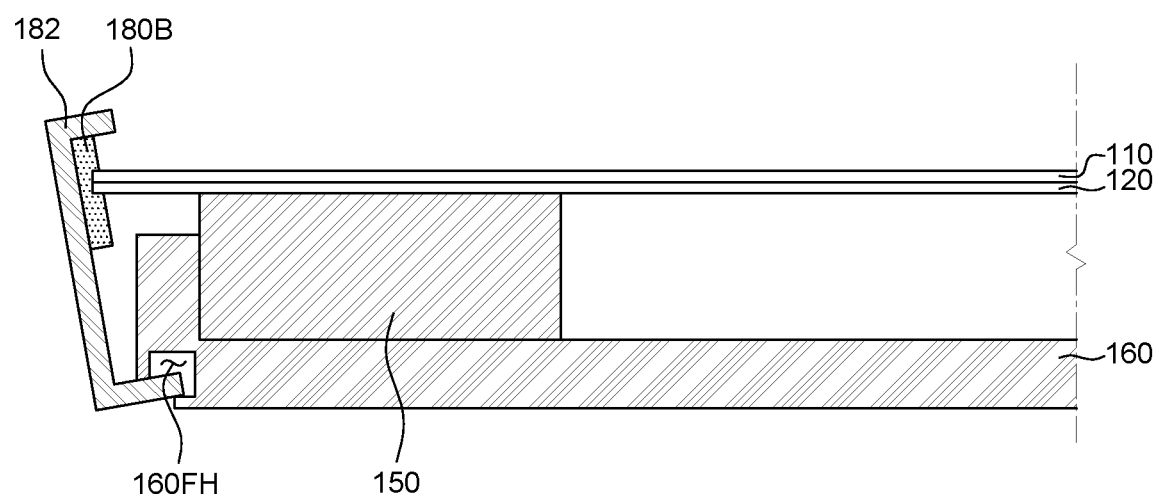
FIG. 5C is a cross-sectional view for describing a second packaging member of the display device according to an exemplary embodiment of the present disclosure.

FIG. 3 is a front perspective view of the display device according to an exemplary embodiment of the present disclosure. FIG. 4 is a rear perspective view of the display device according to an exemplary embodiment of the present disclosure. FIGS. 5A and 5B are cross-sectional views for describing a first packaging member of the display device according to an exemplary embodiment of the present disclosure. FIG. 5C is a cross-sectional view for describing a second packaging member of the display device according to an exemplary embodiment of the present disclosure.

Referring to FIGS. 3 and 4, a plurality of packaging members 180 is connected to the cover shield 160. Therefore, the plurality of packaging members 180 is configured to be in a state to cover the side surfaces of the display panel 120 and the cover shield 160 or in a state to expose the side surfaces of the display panel 120 and the cover shield 160. In FIGS. 3 to 5C, a state in which the plurality of packaging members 180 covers the side surfaces of the display panel 120 and the cover shield 160 is illustrated, and a detailed description of an operation of switching to the state in which the plurality of packaging members 180 exposes the side surfaces of the display panel 120 and the cover shield 160 will be described below with reference to FIGS. 6A to 7C.

Referring to FIGS. 3 and 4, the plurality of packaging members 180 includes a plurality of first packaging members 181 and a plurality of second packaging members 182. The plurality of first packaging members 181 is disposed to correspond to a first side surface and a second side surface of the display panel 120, respectively, and the plurality of second packaging members 182 is disposed to correspond to a third side surface and a fourth side surface of the display panel 120, respectively. Here, the first side surface and the second side surface can be a left side surface and a right side surface, and the third side surface and the fourth side surface can be an upper side surface and a lower side surface, but the present disclosure is not limited thereto. Therefore, the plurality of first packaging members 181 can be configured to cover or expose the first side surface and the second side surface of the display panel 120, and the plurality of second packaging members 182 can be configured to cover or expose the third side surface and the fourth side surface of the display panel 120.

Referring to FIGS. 4 to 5C, a plurality of hinge members 190 is connected to the plurality of packaging members 180 and the cover shield 160. Therefore, the plurality of packaging members 180 can be configured to be rotatable with respect to the cover shield 160 by the plurality of hinge members 190.

The plurality of hinge members 190 includes an elastic member 191 providing elastic force so as to rotate the plurality of packaging members 180 to the rear surface of the cover shield 160. Specifically, the elastic member 191 can provide the elastic force so as to rotate the plurality of first packaging members 181 and the plurality of second packaging members 182 to the rear side of the cover shield 160. The elastic member 191 can be, for example, formed in a form of a spring, but is not limited thereto.

Referring to FIGS. 3 to 5C, when the plurality of packaging members 180 covers the side surface of the display panel 120, the plurality of packaging members 180 is disposed to be inclined on the side surface of the display panel 120. As illustrated in FIGS. 3 to 5C, the first side surface, the second side surface, the third side surface, and the fourth side surface of the display panel 120 are disposed to protrude based on the side surface of the cover shield 160. Therefore, the first side surface, the second side surface, the third side surface, and the fourth side surface of the display panel 120 are disposed outside the cover shield 160 on a cross section. Therefore, when the plurality of packaging members 180 covers the side surface of the display panel 120, the plurality of packaging members 180 is not disposed in parallel to the side surface of the display panel 120, but disposed to be inclined.

Meanwhile, when the plurality of packaging members 180 covers the side surface of the display panel 120, the plurality of packaging members 180 can be designed to be disposed in parallel to the side surface of the display panel 120. In this case, by considering the rotation of the plurality of hinge members 190, the side surface of the cover shield 160 should protrude outside the display panel 120. However, if the side surface of the cover shield 160 protrudes outside the display panel 120, when the display device 100 is tiled, a distance between the display devices 100 adjacent to each other increases, so that the tiled display devices 100 can be recognized as not one screen but split screens. Therefore, when the plurality of packaging members 180 covers the side surface of the display panel 120, the plurality of packaging members 180 is not disposed in parallel to the side surface of the display panel 120, but preferably disposed to be inclined.

Referring to FIGS. 5A to 5C, the plurality of packaging members 180 can include a buffer member 180B that protects the side surface of the display panel 120. Since the display panel 120 can be disposed outside the cover shield 160, the side surface of the display panel 120, e.g., a wire disposed on the side surface of the display panel 120 can be damaged in a process in which the plurality of packaging members 180 contacts the side surface of the display panel 120. Therefore, the plurality of packaging members 180 can include a buffer member 180B that absorbs an impact in order to suppress the side surface of the display panel 120 from being damaged. Therefore, the packaging member can minimize the damage of the display panel 120 without excessively pressing the side surface of the display panel 120 disposed outside a frame 150. The buffer member 180B can be, for example, a sponge, but is not limited thereto.

Referring to FIG. 5B, the plurality of first packaging members 181 includes a plurality of fixation plates 181F disposed to be fixable to a plurality of panel magnets MG. The plurality of fixation plates 181F is inserted into a side hole 160SH of the cover shield 160 for exposing the plurality of panel magnets MG at positions corresponding to the plurality of panel magnets MG to be fixed by the plurality of panel magnets MG when the first packaging member 181 covers the side surface of the display panel 120. When the first packaging member 181 covers the side surface of the display panel 120, the fixation plate 181F is fixed by magnetic force of the panel magnet MG to maintain a state in which the first packaging member 181 covers the side surface of the display panel 120.

Referring to FIG. 5C, the plurality of second packaging members 182 is disposed to be fixable to the cover shield 160. Specifically, the cover shield 160 can include a fixation hole 160FH disposed at a position corresponding to a position at which the second packaging member 182 is disposed, and the second packaging member 182 can be fixed by the fixation hole 160FH of the cover shield 160. Therefore, when the second packaging member 182 covers the side surface of the display panel 120, the state in which the second packaging member 182 covers the side surface of the display panel 120 can be maintained. For example, the second packaging member 182 can be fixed to the fixation hole 160FH of the cover shield 160 by hook coupling, but a fixation method is not limited thereto.

Hereinafter, the operations of the plurality of packaging members of the display device according to an exemplary embodiment of the present disclosure will be described with reference to FIGS. 6A to 7C together.

Figure 6A:
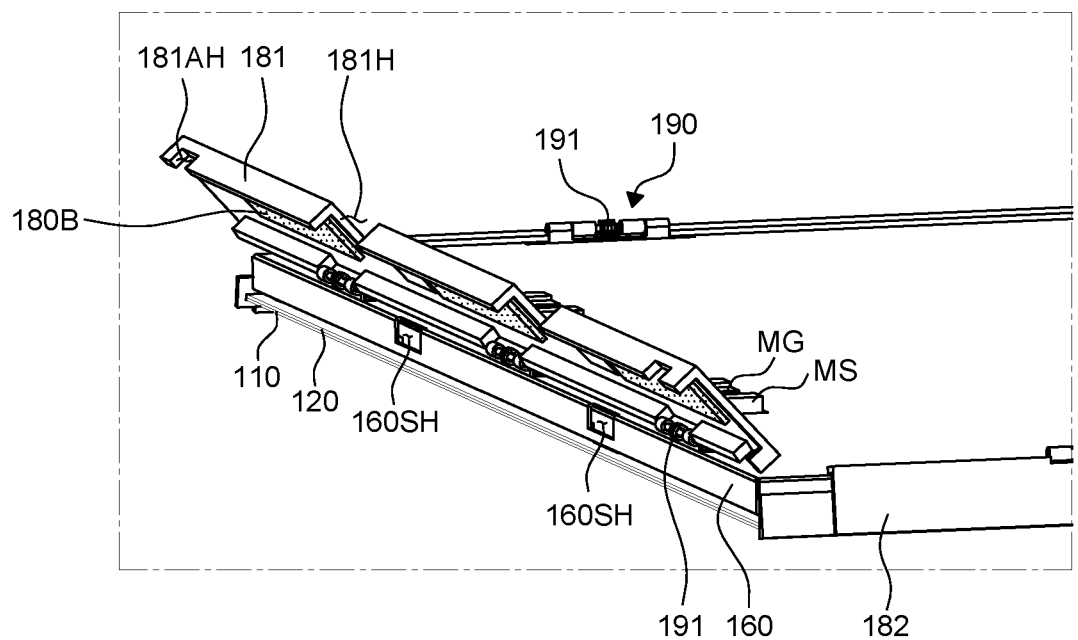
FIGS. 6A to 6C are diagrams for describing an operation of a first packaging member of the display device according to an exemplary embodiment of the present disclosure.
Figure 6B:
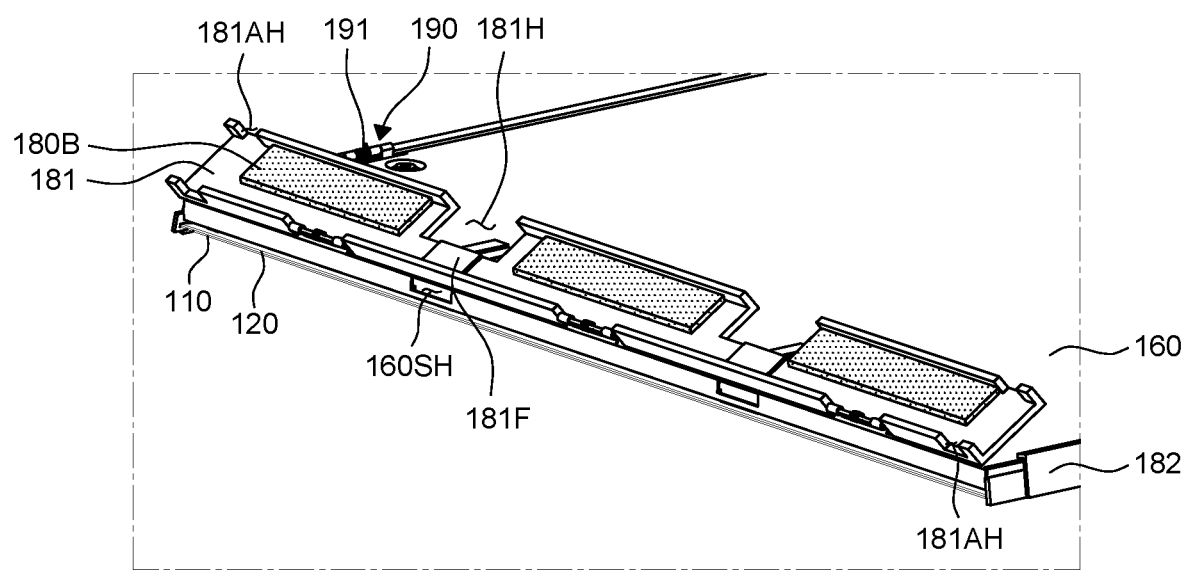
Figure 6C:
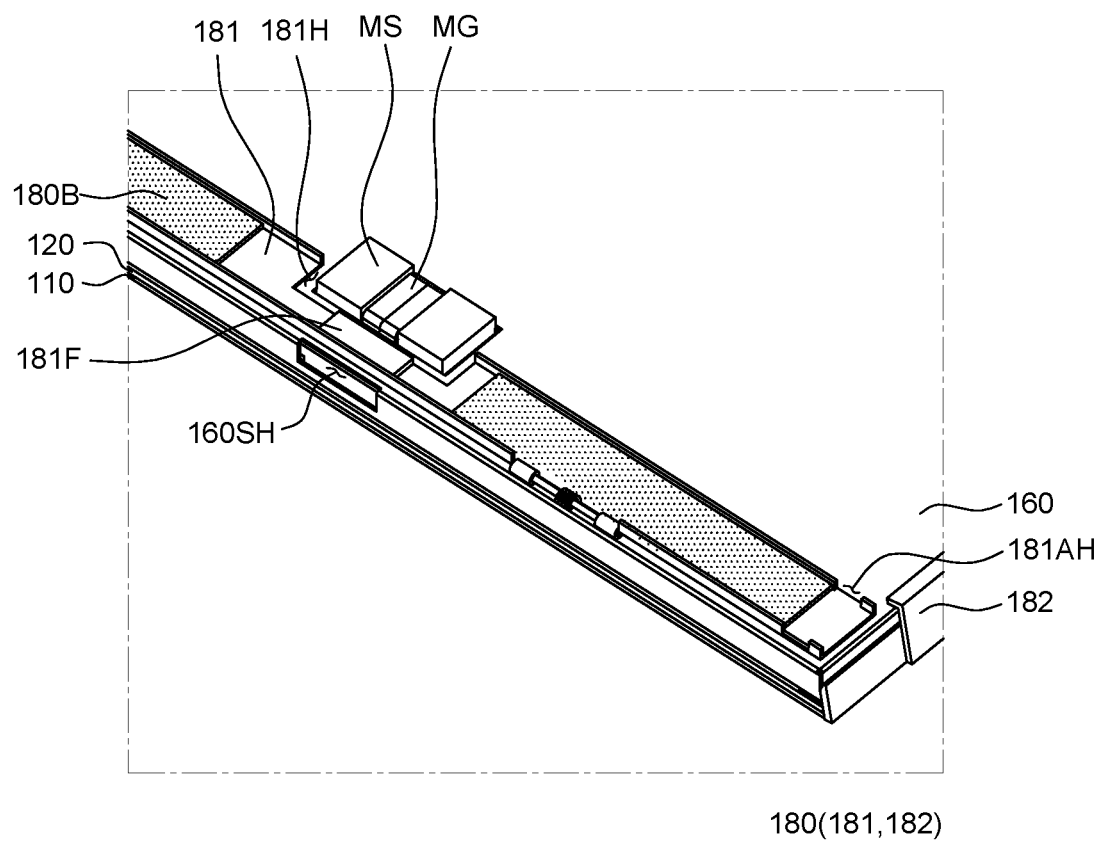
Figure 7A:
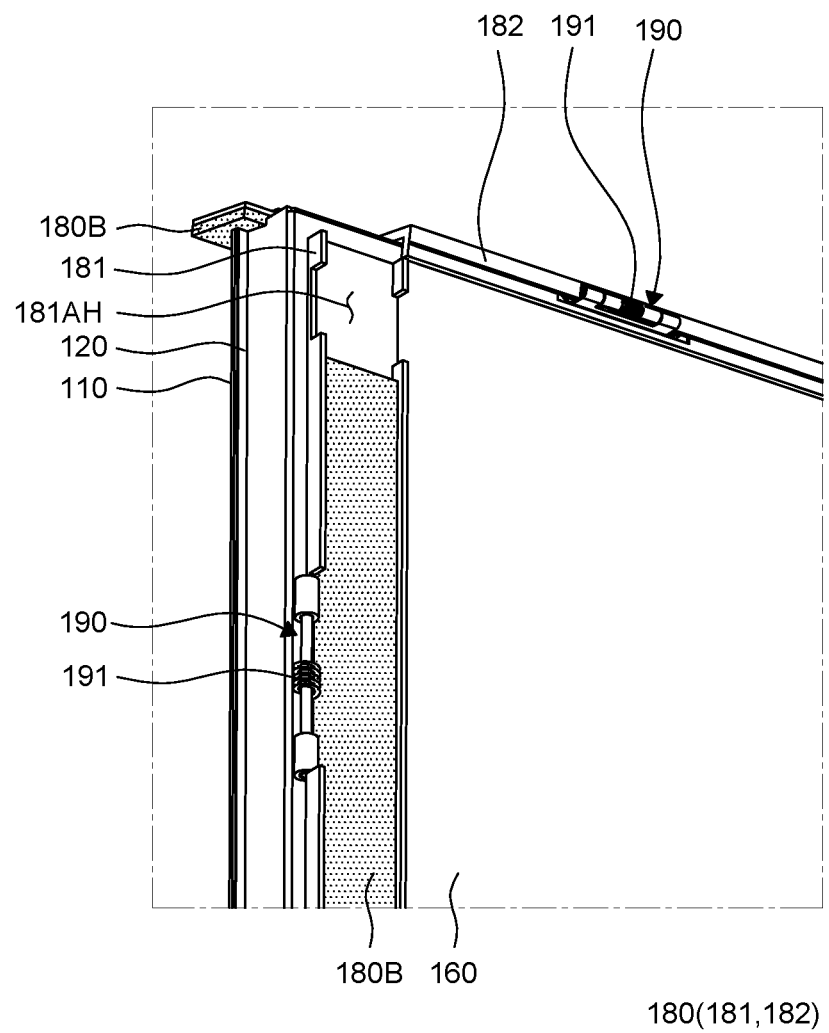
FIGS. 7A to 7C are diagrams for describing an operation of a second packaging member of the display device according to an exemplary embodiment of the present disclosure.
Figure 7B:
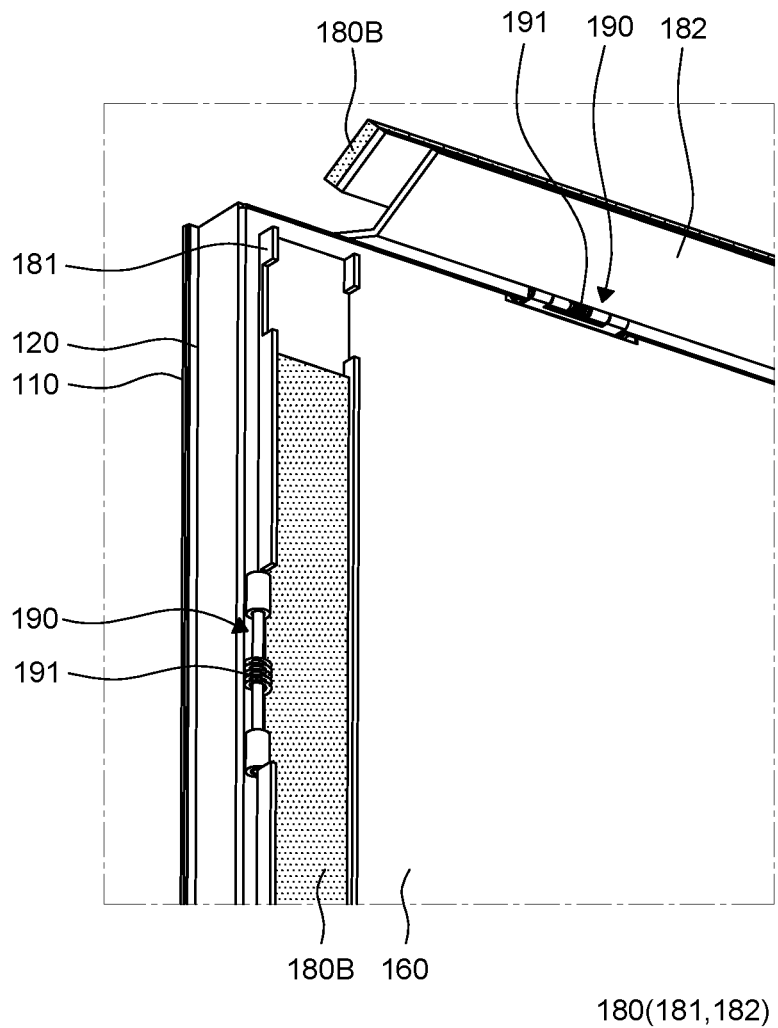
Figure 7C:
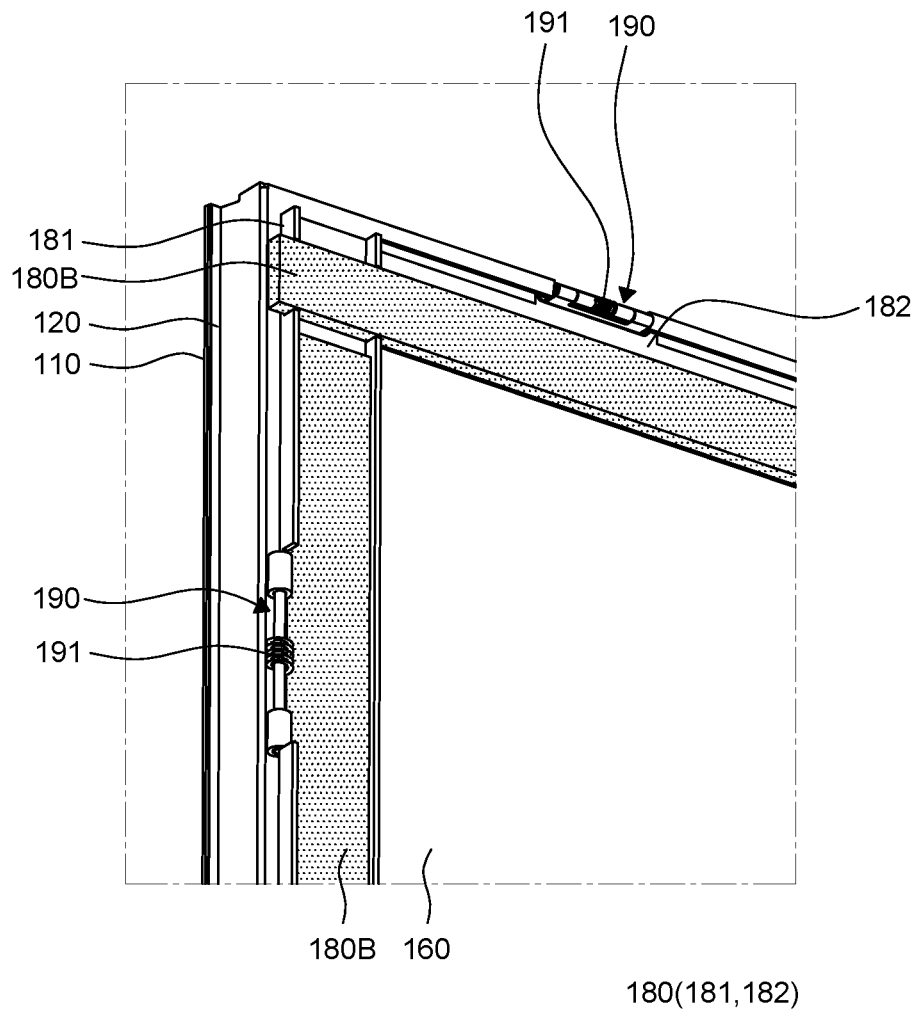

FIGS. 6A to 6C are diagrams for describing an operation of a first packaging member of the display device according to an exemplary embodiment of the present disclosure. FIGS. 7A to 7C are diagrams for describing an operation of a second packaging member of the display device according to an exemplary embodiment of the present disclosure.

Particularly, FIG. 6A is a diagram for describing a state in which external magnetic force is applied to the panel magnet MG and a panel ferromagnetic material MS, and FIGS. 6B and 6C are diagrams for describing a process in which the plurality of first packaging members 181 rotates in a rear direction of the cover shield 160 on the side surface of the display panel 120. FIG. 7A is a diagram for describing that the plurality of second packaging members 182 is separated from the fixation hole 160FH of the cover shield 160, and FIGS. 7B and 7C are diagrams for describing a process in which the plurality of second packaging members 182 rotates in the rear direction of the cover shield 160 on the side surface of the display panel 120.

First, a user can use a tool such as amounting jig in the display device 100 in order to tile the display device 100. In this case, the mounting jig can fix the mounting jig and the display device 100 by a method of applying the magnetic force to the plurality of panel magnets MG and panel ferromagnetic materials MS of the display device 100. For example, the mounting jig can include a magnet and a ferromagnetic material corresponding to the panel magnet MG and the panel ferromagnetic material MS, and arrange the magnet and the ferromagnetic material on a front surface of the display panel 120 to correspond to the panel magnet MG and the panel ferromagnetic material MS. In this case, strong magnetic force is generated between the magnet MG and the panel ferromagnetic material MS and the magnet and the ferromagnetic material of the mounting jig to fix the display device 100 to the mounting jig.

Referring to FIG. 6A, as described above, strong magnetic force is generated between the panel magnet MG and the panel ferromagnetic material MS and the magnet and the ferromagnetic material of the mounting jig, and as a result, the magnetic force between the panel magnet MG and the fixation plate 181F can be weakened. Therefore, the fixation plate 181F is separated from the panel magnet MG. In this case, the hinge member 190 rotates by the elastic member 191, and the first packaging member 181 rotates from the side surface of the display panel 120 to the rear surface of the cover shield 160.

Referring to FIG. 6B, the plurality of first packaging members 181 includes a plurality of holes 181H providing a space in which the plurality of panel magnets MG is disposed. When the plurality of first packaging members 181 rotates by the plurality of hinge members 190 and is disposed on the rear surface of the cover shield 160, the plurality of holes 181H can provide the space in which the plurality of panel magnets MG is disposed. In this case, the fixation plate 181F can be disposed adjacent to the plurality of holes 181H.

Referring to FIG. 6C, the plurality of first packaging members 181 is disposed on the rear surface of the cover shield 160. In this case, the plurality of panel magnets MG can be disposed in the plurality of holes 181H of the plurality of first packaging members 181. For example, the plurality of panel magnets MG and panel ferromagnetic materials MS can be disposed in the plurality of holes 181H of the plurality of first packaging members 181. Therefore, the fixation plate 181F can be disposed in contact with or adjacent to the plurality of panel magnets MG and panel ferromagnetic materials MS. Since the elastic member 191 provides elastic force to rotate the plurality of first packaging members 181 to the rear surface of the cover shield 160 as described above, a state in which the plurality of first packaging members 181 is disposed on the rear surface of the cover shield 160 can be maintained by the elastic force.

In this case, the plurality of first packaging members 181 is disposed on the rear surface of the cover shield 160, but the plurality of second packaging members 182 still covers the side surface of the display panel 120, and as a result, the mounting jig is not separated. Therefore, the magnetic force between the fixation plate 181F and the plurality of panel magnets MG is weak and the magnetic force between the magnet and the ferromagnetic material of the mounting jig and the panel magnet MG and the panel ferromagnetic material MS is strong.

Meanwhile, referring to FIG. 6C, the plurality of first packaging members 181 includes accommodation holes 181AH. Although will be described below, as the plurality of second packaging members 182 rotates from the side surface of the display panel 120 to the rear surface of the cover shield 160, some of the plurality of second packaging members 182 can be accommodated in the accommodation holes 181AH of the plurality of first packaging members 181.

Referring to FIG. 7A, when external force is applied to the plurality of second packaging members 182, the plurality of second packaging members 182 is separated from the fixation holes 160FH of the cover shield 160. For example, when the user applies external force enough to separate the second packaging member 182 from the fixation hole 160FH of the cover shield 160, the plurality of second packaging members 182 is separated from the fixation hole 160FH of the cover shield 160.

Referring to FIG. 7B, as the second packaging member 182 is separated from the fixation hole 160FH of the cover shield 160, the hinge member 190 rotates by the elastic member 191. Therefore, the second packaging member 182 rotates from the side surface of the display panel 120 to the rear surface of the cover shield 160.

Referring to FIG. 7C, the plurality of second packaging members 182 is disposed on the rear surface of the cover shield 160. In this case, ends of the plurality of second packaging members 182 can be accommodated in the accommodation holes 181AH of the plurality of first packaging members 181. Therefore, the plurality of first packaging members 181 can be disposed between the cover shield 160 and the plurality of second packaging members 182 at a corner portion of the cover shield 160. Since the elastic member 191 provides elastic force to rotate the plurality of second packaging members 182 to the rear surface of the cover shield 160 as described above, a state in which the plurality of second packaging members 182 is disposed on the rear surface of the cover shield 160 can be maintained by the elastic force.

In a state in which the plurality of first packaging members 181 and the plurality of second packaging members 182 are disposed on the rear surface of the cover shield 160, the user can tile the display device 100. For example, the user can tile the display device 100 to the wall surface portion 200 by using the mounting jig. When the display device 100 is aligned at a desired position on the wall surface portion 200, the user can remove the mounting jig. In this case, the plurality of fixation plates 181F can be fixed by the plurality of panel magnets MG disposed in the plurality of holes 181H of the plurality of first packaging members 181. For example, when the mounting jig is separated from the front surface of the display panel 120, the magnetic force between the panel magnet MG disposed in the hole 181H of the first packaging member 181 and the fixation plate 181F is strengthened, and as a result, the fixation plate 181F can be fixed by the panel magnet MG.

In the case of the display device 100 used for manufacturing the tiling display device 1000, in order to implement a zero bezel, a part such as the flexible film 130 or the printed circuit board 140 can be located on the rear surface of the display panel 120 and the wire can be located on the side surface of the display panel 120 in order to connect the wire located on a top surface of the display panel 120 to the flexible film 130. However, when the impact is applied to the side surface of the display panel 120, there is a problem in that the wire located on the side surface of the display panel 120 is damaged or disconnected.

In order to address this issue, a method of covering the side surface of the display device 100 with a protection part and fastening the side surface and the protection part by a hook fastening method or a screw fastening method is used. Such a method is a method of assembling the protection part to the outside of the display device 100 when transporting the display device 100 and removing the protection part when tiling the display device 100.

However, when such a method is used, there is a disadvantage in that it is cumbersome to detach the protection part from the display device 100 and a lot of cost can be consumed to reproduce the protection part removed after tiling the display device 100 every time. Meanwhile, the protection part should be separately stored in order to reuse the protection part without reproducing them for reducing costs. However, in this case, there is also a limitation in that a separate space for storing the protection part can be needed and the protection part can be lost.

Therefore, in the display device 100 according to an exemplary embodiment of the present disclosure, the plurality of packaging members 180 covers the side surface of the display panel 120 when transporting the display device 100 and the plurality of packaging members 180 is disposed on the rear surface of the display panel 120 when tiling the display device 100. Therefore, detachment of the packaging member 180 for protecting the display device 100 can be conveniently improved and the packaging member 180 can be easily reused, and simultaneously, the loss risk of the packaging member 180 can be minimized.

Specifically, in the display device 100 according to an exemplary embodiment of the present disclosure, the plurality of packaging members 180 can cover and protect the side surfaces of the display panel 120 when conveying the display device 100. In this case, since the plurality of packaging members 180 includes the buffer member 180B that protects the side surface of the display panel 120, the plurality of packaging members 180 can protect the side surface of the display panel 120 more safely.

Further, in the display device 100 according to an exemplary embodiment of the present disclosure, when the external magnetic force is applied to the front surface of the display device 100 by using an external tool such as the mounting jig at the time of a tiling operation, the first packaging member 181 can rotate to the rear surface of the cover shield 160. As described above, rotation of the plurality of packaging members 180 can be easily controlled on not the rear surface but the front surface of the display device 100. Therefore, the plurality of packaging members 180 can be conveniently detached from the side surface of the display panel 120.

Further, in the display device 100 according to an exemplary embodiment of the present disclosure, since the plurality of packaging members 180 is disposed on the rear surface of the cover shield 160 and connected to the cover shield 160 by the hinge member 190 while tiling, the plurality of packaging members 180 can be easily reused. For example, since the packaging member 180 connected to the cover shield 160 can be easily reused to protect the side surface of the display panel 120 again, and simultaneously, the loss risk of the packaging member 180 can be minimized, consumption cost for reproducing the packaging member 180 can be reduced and a separate storage space may not be necessary to be secured.

The exemplary embodiments of the present disclosure can also be described as follows:

According to an aspect of the present disclosure, a display device can include a display panel; a plurality of panel magnets disposed on a rear surface of the display panel along a first side surface of the display panel and a second side surface facing the first side surface; a cover shield disposed on the rear surface of the display panel, in which positions corresponding to the plurality of panel magnets are opened to expose the plurality of panel magnets; a plurality of packaging members configured to be connected to the cover shield to cover or expose the side surfaces of the display panel and the cover shield; and a plurality of hinge members connected to the plurality of packaging members and the cover shield so that the plurality of packaging members is rotatable with respect to the cover shield, in which the plurality of packaging members includes a plurality of first packaging members disposed to correspond to the first side surface and the second side surface of the display panel, respectively, and including a plurality of fixation plates disposed to be fixable to the plurality of panel magnets, and a plurality of second packaging members disposed to correspond to a third side surface and a fourth side surface of the display panel, and disposed to be fixable to the cover shield.

The cover shield can include a plurality of side holes for exposing the plurality of panel magnets at the positions corresponding to the plurality of panel magnets on the side surface. The plurality of fixation plates can be inserted into the plurality of side holes and fixed by the plurality of panel magnets.

The plurality of hinge members can include an elastic member providing elastic force so as to rotate the plurality of packaging members to a rear surface of the cover shield.

When the plurality of first packaging members rotates by the plurality of hinge members and is disposed on a rear surface of the cover shield, the plurality of first packaging members can include a plurality of holes providing a space in which the plurality of panel magnets is disposed.

The plurality of fixation plates can be fixed by the plurality of panel magnets disposed in the plurality of holes.

When the plurality of first packaging members and the plurality of second packaging members rotate by the plurality of hinge members and are disposed on a rear surface of the cover shield, the plurality of first packaging members can be disposed between the cover shield and the plurality of second packaging members.

The plurality of first packaging members can further include accommodation holes capable of accommodating the plurality of second packaging members.

When the plurality of packaging members covers the side surface of the display panel, the plurality of packaging members can be disposed to be inclined on the side surface of the display panel.

The plurality of packaging members can further include a buffer member protecting the side surface of the display panel.

The cover shield can include fixation holes disposed to fix the plurality of second packaging members.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The invention claimed is:

1. A display device comprising:
   a display panel;
   a plurality of panel magnets disposed on a rear surface of the display panel, along a first side surface of the display panel and a second side surface facing the first side surface;
   a cover shield disposed on the rear surface of the display panel, in which positions corresponding to the plurality of panel magnets are opened to expose the plurality of panel magnets;
   a packaging member configured to be connected to the cover shield to cover or expose the first and second side surfaces of the display panel and the cover shield; and
   a plurality of hinge members connected to the packaging member and the cover shield so that the packaging member is rotatable with respect to the cover shield,
   wherein the packaging member includes:
      a plurality of first packaging members disposed to correspond to the first side surface and the second side surface of the display panel, respectively, and including a plurality of fixation plates disposed to be fixable to the plurality of panel magnets, and
      a plurality of second packaging members disposed to correspond to a third side surface and a fourth side surface of the display panel, and disposed to be fixable to the cover shield.

2. The display device of claim 1, wherein the cover shield includes a plurality of side holes for exposing the plurality of panel magnets at the positions corresponding to the plurality of panel magnets, and
   the plurality of fixation plates is inserted into the plurality of side holes and fixed by the plurality of panel magnets.

3. The display device of claim 1, wherein the plurality of hinge members includes an elastic member providing elastic force so as to rotate the packaging member to a rear surface of the cover shield.

4. The display device of claim 1, wherein when the plurality of first packaging members rotates by the plurality of hinge members and is disposed on a rear surface of the cover shield, the plurality of first packaging members includes a plurality of holes providing a space in which the plurality of panel magnets is disposed.

5. The display device of claim 4, wherein the plurality of fixation plates is fixed by the plurality of panel magnets disposed in the plurality of holes.

6. The display device of claim 1, wherein when the plurality of first packaging members and the plurality of second packaging members rotate by the plurality of hinge members and are disposed on a rear surface of the cover shield, the plurality of first packaging members is disposed between the cover shield and the plurality of second packaging members.

7. The display device of claim 6, wherein the plurality of first packaging members further includes a plurality of accommodation holes configured to accommodate the plurality of second packaging members.

8. The display device of claim 1, wherein when the packaging member covers at least one of the first to fourth side surfaces of the display panel, the packaging member is disposed to be inclined on the at least one side surface of the display panel.

9. The display device of claim 1, wherein the packaging member further includes a buffer member protecting at least one of the first to fourth side surfaces of the display panel.

10. The display device of claim 1, wherein the cover shield includes a plurality of fixation holes disposed to fix the plurality of second packaging members.

* * * * *